United States Patent
Zhou

(10) Patent No.: US 8,253,530 B2
(45) Date of Patent: Aug. 28, 2012

(54) KEYBOARD FOR POWERING ON OR OFF COMPUTER

(75) Inventor: Hai-Qing Zhou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 453 days.

(21) Appl. No.: 12/686,286

(22) Filed: Jan. 12, 2010

(65) Prior Publication Data

US 2011/0115651 A1    May 19, 2011

(30) Foreign Application Priority Data

Nov. 17, 2009    (CN) .......................... 2009 1 0309843

(51) Int. Cl.
*G06F 7/04* (2006.01)

(52) U.S. Cl. ......... 340/5.51; 341/22; 345/168; 200/344; 84/423 R; 361/679.09

(58) Field of Classification Search ................ 340/5.51; 345/168; 341/22; 200/344; 84/423 R; 361/679.09
See application file for complete search history.

(56) References Cited

U.S. PATENT DOCUMENTS

| | | | | |
|---|---|---|---|---|
| 6,046,721 A | * | 4/2000 | Song et al. | ...................... 345/13 |
| 2010/0039388 A1 | * | 2/2010 | Ku | ................. 345/168 |
| 2011/0148571 A1 | * | 6/2011 | Ge et al. | ...................... 340/5.51 |
| 2011/0169618 A1 | * | 7/2011 | Zhou | .......................... 340/12.22 |
| 2012/0026096 A1 | * | 2/2012 | Ku | ................. 345/168 |

* cited by examiner

*Primary Examiner* — Lam T Mai
(74) *Attorney, Agent, or Firm* — Altis Law Group, Inc.

(57) ABSTRACT

A keyboard can power a computer on or off. A switch arranged on the keyboard receives power on or off operations. A control chip in the keyboard outputs control signals to a microcontroller according to the power on or off operations. The microcontroller actuates a switch circuit to make a control terminal of a motherboard of the computer power on and off the computer.

9 Claims, 3 Drawing Sheets

KEYBOARD FOR POWERING ON OR OFF COMPUTER

BACKGROUND

1. Technical Field

The present disclosure relates to keyboards, and particularly to a keyboard which can power a computer on or off.

2. Description of Related Art

A contemporary keyboard as an input device has very simple functions. The design of the keyboard often focuses on improving keys of the keyboard rather than more uses of the keyboard.

DETAILED DESCRIPTION

Figure 1:
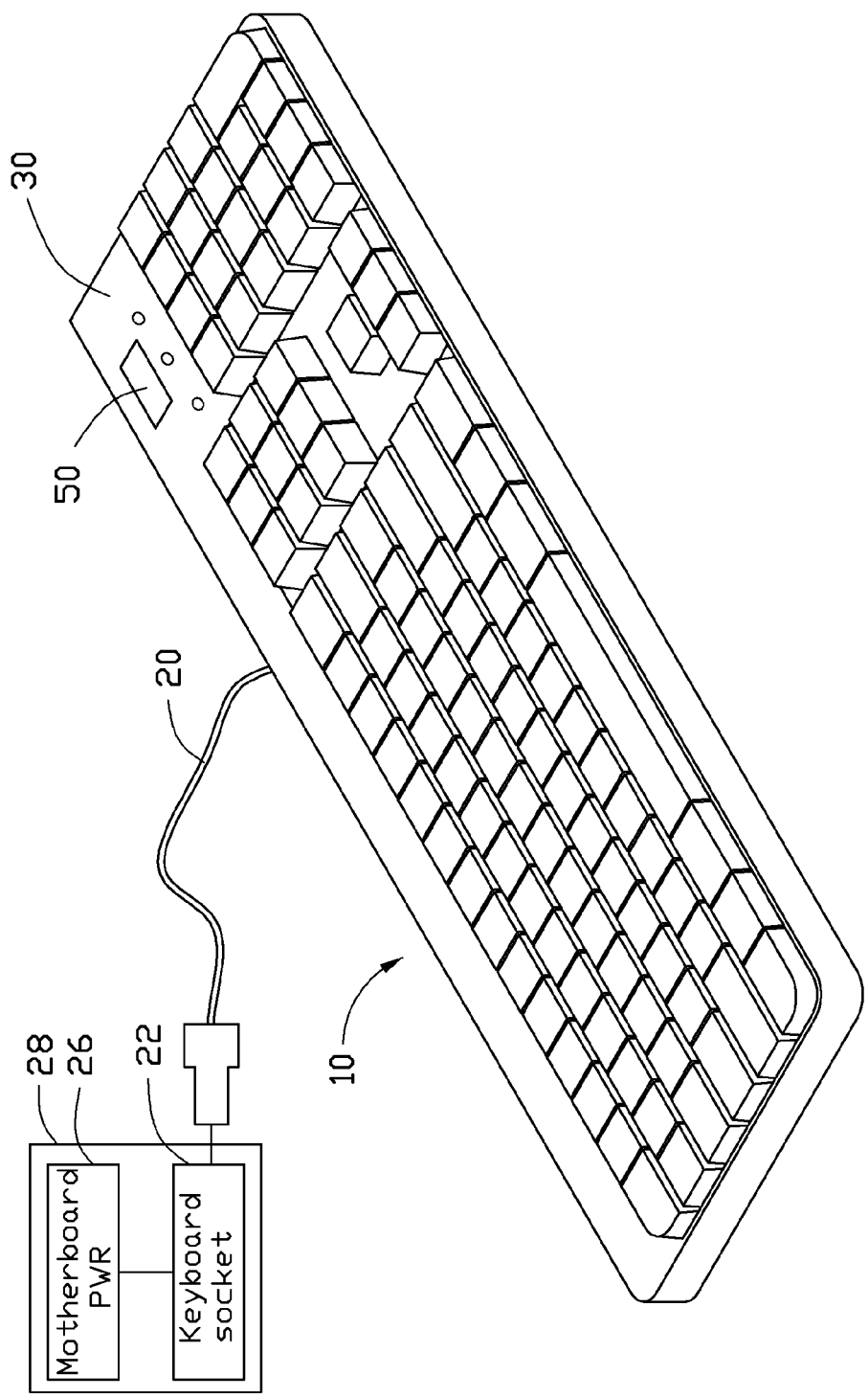
FIG. 1 is a schematic, isometric view of an exemplary embodiment of a keyboard and a computer, the keyboard including an input circuit, a control circuit, a switch circuit, and a detection circuit.
Figure 2:
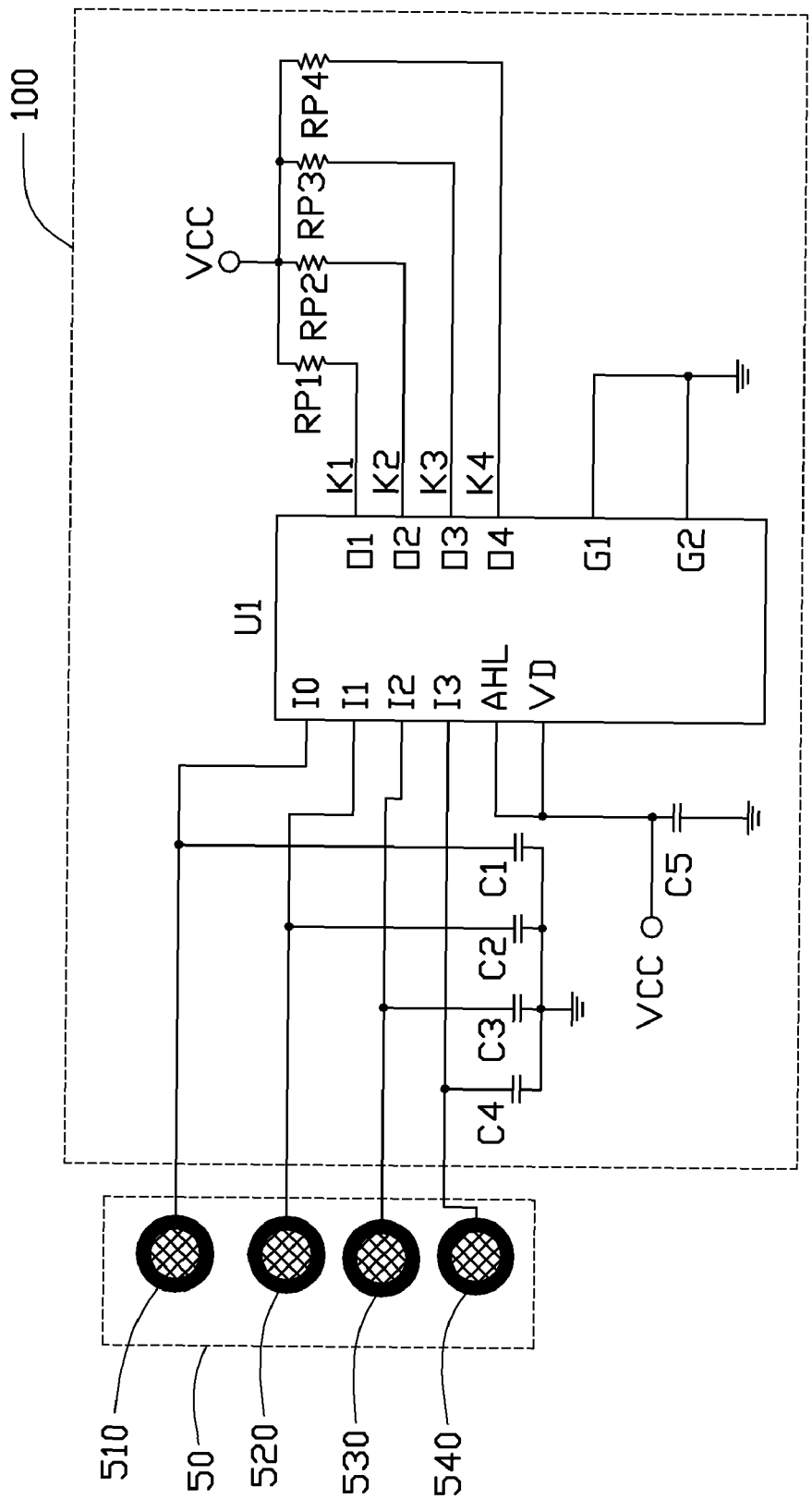
FIG. 2 is a circuit diagram of the input circuit of FIG. 1.
Figure 3:
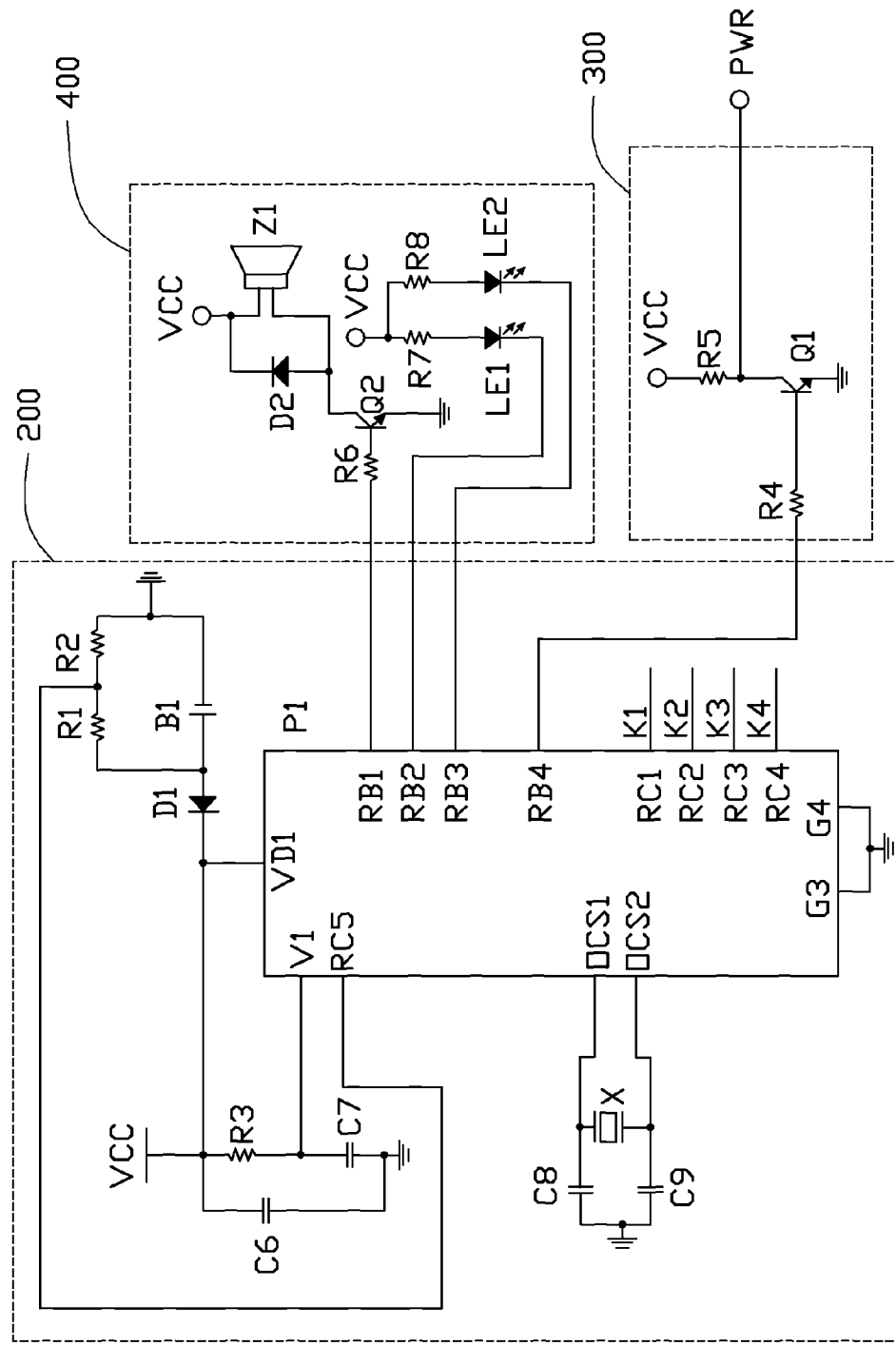
FIG. 3 is a circuit diagram of the control circuit, the switch circuit, and the detection circuit of FIG. 1.

Referring to FIGS. 1 to 3, an exemplary embodiment of a keyboard 10 includes a housing 30, a switch 50 arranged on the housing 30, and an input circuit 100, a control circuit 200, a switch circuit 300, and a detection circuit 400 arranged in the housing 30. The switch 50 includes four trigger terminals 510, 520, 530, and 540.

The input circuit 100, the switch circuit 300, and the detection circuit 400 are all connected to the control circuit 200. The four trigger terminals 510, 520, 530, and 540 of the switch 50 are connected to the input circuit 100. In one embodiment, the switch 50 may be a touch switch, a push-type switch, or another kind of switch. The input circuit 100 receives power on or power off operations. The control circuit 200 actuates the switch circuit 300, to power on and power off a computer 28 accordingly.

The input circuit 100 includes a control chip U1, five capacitors C1-C5, and four pull-up resistors RP1-RP4. The control chip U1 includes four input terminals I0-I3, two power supply terminals AHL and VD, four output terminals O1-O4, and two ground terminals G1 and G2. The four input terminals I0-I3 are connected to the trigger terminals 510, 520, 530, and 540 of the switch 50, and are also grounded via the capacitors C1-C4, respectively. The power supply terminals AHL and VD are connected to a power supply VCC, and are also grounded via the capacitor C5. The output terminals O1-O4 are connected to the control circuit 200, and are also connected to the power supply VCC via the pull-up resistors RP1-RP4, respectively. The ground terminals G1 and G2 are grounded. In this embodiment, the power supply VCC is a 5 volts (V) power supply. A type of the control chip U1 is Tch04A. In other embodiments, the capacitors C1-C5 can be omitted, and the control chip U1 can be other types of control chips.

The control circuit 200 includes a crystal oscillator X, a microcontroller P1, three resistors R1-R3, four capacitors C6-C9, a battery B1, and a diode D1. The microcontroller P1 includes two oscillator terminals OCS1 and OCS2, two power supply terminals V1 and VD1, five input terminals RC1-RC5, four output terminals RB1-RB4, and two ground terminals G3 and G4. The crystal oscillator X is connected between the two oscillator terminals OCS1 and OCS2. The two oscillator terminals OCS1 and OCS2 are also grounded via the capacitors C8 and C9, respectively. The power supply terminal VD1 is connected to the power supply VCC. The power supply terminal V1 is connected to the power supply VCC via the resistor R3, and is also grounded via the capacitor C7. The capacitor C6 is connected between the power supply VCC and ground. A cathode of the diode D1 is connected to the power supply VCC. An anode of the diode D1 is connected to an anode of the battery B1, and is also grounded via the resistors R1 and R2 that are connected in series. A cathode of the battery B1 is grounded. A node between the resistors R1 and R2 is connected to the input terminal RC5 of the microcontroller P1. The input terminals RC1-RC4 of the microcontroller P1 are connected to the output terminals O1-O4 of the control chip U1, respectively. The output terminals RB1-RB3 are connected to the detection circuit 400. The output terminal RB4 is connected to the switch circuit 300. The ground terminals G3 and G4 are grounded. In this embodiment, the battery B1 is a 6V power supply, a type of the microcontroller P1 is PRC16F72. In other embodiments, the battery B1 can be another type of power supply, and the microcontroller P1 can be another type of microcontroller.

The switch circuit 300 includes a transistor Q1 and two resistors R4 and R5. A base of the transistor Q1 is connected to the output terminal RB4 of the microcontroller P1 via the resistor R4. An emitter of the transistor Q1 is grounded. A collector of the transistor Q1 is connected to the power supply VCC via the resistor R5, and is also connected to a control terminal PWR of a motherboard 26 of the computer 28, for powering on or off the computer 28. For example, a keyboard cable 20 of the keyboard 10 can be connected to an idle pin of a keyboard socket 22 of the motherboard 26, and the idle pin of the keyboard socket 22 is connected to the control terminal PWR of the motherboard 26. In this embodiment, the transistor Q1 functions as an electronic switch is an npn transistor. In other embodiments, the transistor Q1 can be other types of electronic switches, such as an N-channel metal oxide semiconductor field effect transistor (NMOSFET).

The detection circuit 400 includes a transistor Q2, a diode D2, a buzzer Z1, two light emitting diodes (LEDs) LE1 and LE2, and three resistors R6-R8. A base of the transistor Q2 is connected to the output terminal RB1 of the microcontroller P1 via the resistor R6. An emitter of the transistor Q2 is grounded. A collector of the transistor Q2 is connected to an anode of the diode D2. A cathode of the diode D2 is connected to the power supply VCC. The buzzer Z1 is connected between the anode and the cathode of the diode D2. Cathodes of the LEDs LE1 and LE2 are connected to the output terminals RB2 and RB3 of the microcontroller P1, respectively. Anodes of the LEDs LE1 and LE2 are connected to the power supply VCC via the resistors R7 and R8 respectively. In this embodiment, the transistor Q2 functions as an electronic switch is an npn transistor. In other embodiments, the transistor Q2 can be another type of electronic switch, such as an NMOSFET, and the detection circuit 400 can be omitted as needed.

The following depicts how the keyboard 10 powers on and powers off the computer 28. When the control terminal PWR of the motherboard 26 receives a low level voltage (e.g., 0V) and a current state of the computer 28 is in a powered on state, the computer 28 will be powered off. When the control terminal PWR receives a low level voltage (e.g., 0V) and the current state of the computer 28 is in a powered off state, then the computer 28 will be powered on. When the control terminal PWR receives a high level voltage (e.g., 3V), the computer 28 will remain in the current state.

When the computer 28 needs to be powered on or off, the switch 50 is actuated, that is, at least two of the trigger terminals 510, 520, 530, and 540 of the switch 50 are triggered. At least two of the input terminals I0-I3 of the control chip U1 receive trigger signals from the trigger terminals of the trigger terminals 510, 520, 530, and 540 correspondingly. At least two of the output terminals O1-O4 of the control chip U1 output control signals to the corresponding input terminals of the input terminals RC1-RC4 of the microcontroller P1. For example, if two trigger terminals 510 and 520 of the switch 50 send trigger signals to the input terminals I0 and I1 of the control chip U1, the corresponding output terminals O1 and O2 of the control chip U1 output control signals to the input terminals RC1 and RC2 of the microcontroller P1. When at least two of the input terminals RC1-RC4 of the microcontroller P1 receive the control signals, the output terminal RB4 of the microcontroller P1 is at a high level, such as 3V, the transistor Q1 is turned on to pull the control terminal PWR to a low level, such as 0V, therefore, the computer 28 is powered on. After the computer 28 is powered on, the output terminal RB2 of the microcontroller P1 outputs a low level voltage, such as 0V, the LED LE1 may emit green light to indicate that the computer 28 is powered on. As the power supply VCC, facilitates as a system power supply of the computer 28, provides power during the computer 28 is in the powered on state, the diode D1 is turned off, and the battery B1 does not provide power to the microcontroller P1, thereby saving electricity of the battery B1.

The keyboard 10 can also detect electricity of the battery B1. When the battery B1 is at a low level, such as 5.7V, a voltage of the node between the resistors R1 and R2 drops below a certain value, such as 5V, the microcontroller P1 detects a voltage at the input terminal RC5 is less than a certain value, such as 5V. The output terminal RB1 of the microcontroller P1 is at a high level, such as 3V, the transistor Q2 is turned on. The anode of the diode D2 is at a low level, such as 0V, the diode D2 is turned off, and the buzzer Z1 outputs a sound. The output terminal RB3 of the microcontroller P1 is at a low level, such as 0V, the LED LE2 may emit red light. In other embodiments, the output terminal RB1 of the microcontroller P1 can output a pulse signal in when the battery B1 is at a low level, such as 5.7V, as a result the buzzer Z1 can output a short sound repeatedly to indicate that the battery B1 needs to be replaced.

The keyboard 10 can also prevent the switch 50 from actuating inadvertently by operational errors. When the switch 50 is accidentally actuated, that is, only one of the trigger terminals 510, 520, 530 and 540 of the switch 50 is trigged to send a trigger signal to one of the input terminals I0-I3 of the control chip U1. One of the output terminals O1-O4 of the control chip U1 outputs a corresponding control signal to one of the input terminals RC1-RC4 of the microcontroller P1. For example, the trigger input terminal 510 of the switch 50 outputs a trigger signal to the input terminal I0 of the control chip U1. The output terminal O1 of the control chip U1 outputs a corresponding control signal to the input terminal RC1 of the microcontroller P1. The output terminal RB3 of the microcontroller P1 is at a low level (e.g., 0V), and the LED LE2 emits red light.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A keyboard comprising:
a switch to receive power on or off operations;
a control chip connected to the switch, to output control signals according to the power on or off operations;
a microcontroller connected to the control chip; and
a switch circuit to be connected to a motherboard of a computer for powering on or off the computer, and to be turned on by the microcontroller to make a control terminal of the motherboard power on or off the computer.

2. The keyboard of claim 1, wherein the control chip comprises a plurality of input terminals, two power supply terminals, four output terminals, and two ground terminals, the plurality of input terminals is connected to the switch, the power supply terminals are connected to a power supply, the output terminals are connected to the control circuit, and are also connected to the power supply via a pull-up resistor, respectively, and the ground terminals are grounded.

3. The keyboard of claim 2, wherein the switch comprises four trigger terminals, and the plurality of input terminals of the control chip comprises four input terminals, and the trigger terminals are connected to the input terminals, respectively, at least two of the trigger terminals of the switch are triggered in response to the switch receiving power on or off operations, and at least two of the input terminals of the control chip receive trigger signals from the trigger terminals.

4. The keyboard of claim 3, further comprising first to fifth capacitors, the first to fourth capacitors are connected between the trigger terminals and ground, respectively, and the fifth capacitor is connected between the power supply and ground.

5. The keyboard of claim 1, further comprising a crystal oscillator, a diode, and a battery, wherein the microcontroller comprises two oscillator terminals, a first and a second power supply terminals, a first to a fifth input terminals, an output terminal, and two ground terminals, the crystal oscillator is connected between the two oscillator terminals, the two oscillator terminals are also grounded via a first and a second capacitors, respectively, the first power supply terminal is connected to a power supply, the second power supply terminal is connected to the power supply via a first resistor, and is also grounded via a third capacitor, a fourth capacitor is connected between the power supply and ground, a cathode of the diode is connected to the power supply, an anode of the diode is connected to an anode of the battery, and is also grounded via a second and a third resistors that are connected in series, a cathode of the battery is grounded, a node between the second and third resistors is connected to the first input terminal of the microcontroller, the second to fifth input terminals of the microcontroller are connected to the control chip, the output terminal is connected to the switch circuit, and the ground terminals are grounded.

6. The keyboard of claim 1, wherein the switch circuit comprises an electronic switch, a first terminal of the electronic switch is connected to the microcontroller via a first resistor, a second terminal of the electronic switch is grounded, a third terminal of the electronic switch is connected to a power supply via a second resistor, and is also connected to the control terminal of the motherboard of the computer, wherein when the switch receives the power on or off operation, the first terminal of the electronic switch is at a high level, the electronic switch is turned on to make the control terminal of the motherboard power on or off the computer.

7. The keyboard of claim 6, wherein the electronic switch is an npn transistor, and the first to third terminals of the electronic switch are a base, an emitter, and a collector of the transistor, respectively.

8. The keyboard of claim 1, further comprising an electronic switch, a diode, a buzzer, and two light emitting diodes (LEDs), a first terminal of the electronic switch is connected to the microcontroller via a first resistor, a second terminal of the electronic switch is grounded, a third terminal of the electronic switch is connected to an anode of the diode, a cathode of the diode is connected to a power supply, the buzzer is connected between the anode and the cathode of the diode, cathodes of the LEDs are connected to the microcontroller, and anodes of the LEDs are connected to the power supply via second and third resistors, respectively.

9. The keyboard of claim 8, wherein the electronic switch is an npn transistor, and the first to third terminals of the electronic switch are a base, an emitter, and a collector of the transistor, respectively.

* * * * *